United States Patent [19]

Hawrylo

[11] Patent Number: 4,576,326

[45] Date of Patent: Mar. 18, 1986

[54] METHOD OF BONDING SEMICONDUCTOR DEVICES TO HEATSINKS

[75] Inventor: Frank Z. Hawrylo, Hamilton Township, Mercer County, N.J.

[73] Assignee: RCA Corporation, Princeton, N.J.

[21] Appl. No.: 610,008

[22] Filed: May 14, 1984

[51] Int. Cl.[4] .................... B21D 39/00; B23K 31/02; B23K 1/20

[52] U.S. Cl. ............................. 228/171; 228/173.3; 228/188; 228/205; 29/90 R; 51/235

[58] Field of Search .................. 228/172, 173.2, 173.3, 228/188, 205, 210, 171; 29/90 R; 51/235

[56] References Cited

U.S. PATENT DOCUMENTS

| | | | |
|---|---|---|---|
| 283,865 | 8/1883 | Covell | 29/90 R |
| 3,139,680 | 7/1964 | Scuro | 228/205 |
| 3,451,607 | 6/1969 | Miller et al. | 228/1 |
| 3,562,482 | 2/1971 | Friedberg et al. | 219/86 |
| 3,613,107 | 10/1971 | Cavagnero | 219/105 |
| 3,676,214 | 7/1972 | English et al. | 117/217 |
| 3,695,501 | 10/1972 | Radobenko | 228/3 |
| 3,840,978 | 10/1971 | Lynch et al. | 228/205 |
| 3,883,946 | 5/1975 | Dale | 228/121 |
| 3,918,144 | 11/1975 | Mimata et al. | 228/205 |
| 3,946,334 | 3/1976 | Yonezu et al. | 331/94.5 |
| 4,457,467 | 7/1984 | Klement et al. | 228/188 |

OTHER PUBLICATIONS

Copending application "Method of Burnishing Malleable Films on Semiconductor Substrates" by F. Z. Hawrylo filed concurrently herewith.

Primary Examiner—Frederick R. Schmidt
Assistant Examiner—Bradley I. Vaught
Attorney, Agent, or Firm—Birgit E. Morris; Theodore R. Furman

[57] ABSTRACT

A method for matching the bonding pad surfaces of a device and heatsinks to be bonded, which method maximizes the uniformity of pressure applied during thermocompression bonding, is disclosed. The method comprises using the collet of a die bonding machine to burnish the bonding pad on a heatsink. The collet is then traversed to a second workstage where the collet is used to pick up a device and burnish the device bonding pad against a suitable burnishing medium. The collet, with the device, is then traversed back to the main workstage where thermocompression bonding of the device to the heatsink is carried out. The alignment of the collet is locked and maintained throughout all of the steps to insure that all burnished surfaces are parallel and that the pressure during bonding is perfectly perpendicular to those parallel surfaces.

3 Claims, 6 Drawing Figures

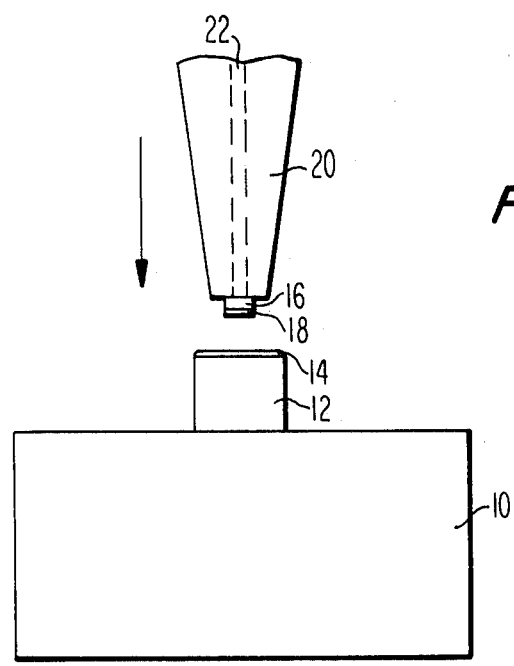
Fig. 1
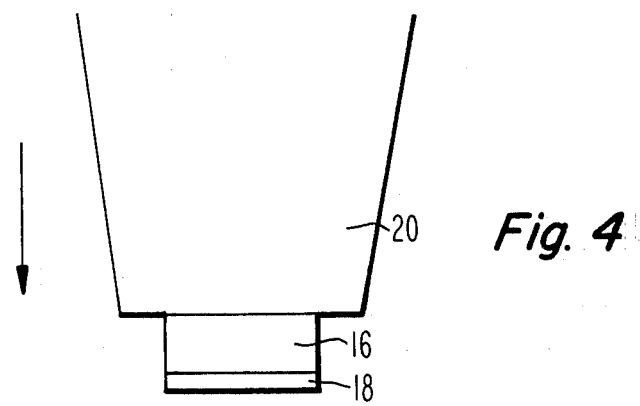
Fig. 4
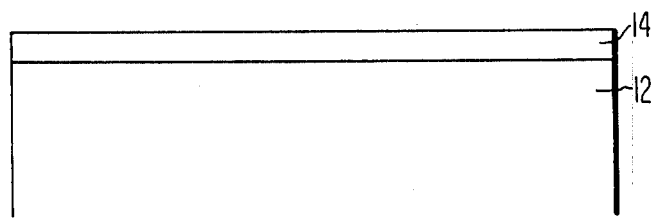

METHOD OF BONDING SEMICONDUCTOR DEVICES TO HEATSINKS

The Government has rights in this invention pursuant to a government contract.

BACKGROUND OF THE INVENTION

This invention relates generally to a method of bonding semiconductor devices to heatsinks and specifically relates to a method which provides a more uniform, parallel pressure between a device and a heatsink in a thermocompression bonding process.

It is known to use thermocompression bonding to bond semiconductor devices to headers and heatsinks in the semiconductor art. Often, to facilitate thermocompression bonding, thick metallic films, called bonding pads, are deposited on the surfaces to be joined. The bonding pads are typically of a malleable metal or alloy. When the two bodies are pressed together, the bonding pads compress and are fused by the appropriate combination of temperature, pressure and time. The malleable nature of the pad can also serve to absorb some of the stress of the pressure applied during the process. Thermocompression bonding provides bonding of two objects at a temperature lower than the melting point of the pad material and without the use of a flux.

A problem with bonding small semiconductor devices to heatsinks is the susceptibility of the device to damage or breakage from the pressure applied. For example, electroluminescent devices of gallium arsenide, indium phosphide and the like, because of their inherent strain, can only withstand limited amounts of stress before crystalline damage occurs. Often the pressures required to bond these devices to heatsinks using high-quality gold or gold alloy bonding pads approach the stress limits for the crystalline materials. This damage adversely affects the life of the device.

Even when the bonding is carried out at pressures below the stress limits for a given crystal, damage can result. Misalignment of the device and the heatsink can concentrate all of the pressure in one small area and this point pressure can far exceed the stress limits for the crystalline device. Excessive pressure is also exerted on nodules or high points on the bonding pads.

It therefore becomes important to apply a uniform, parallel pressure to the bonding pads during the bonding process. Providing bonding pads with smooth, defect-free surfaces is the first step towards accomplishing this purpose.

A copending application entitled "Method of Burnishing Malleable Films on Semiconductor Substrates" by F. Z. Hawrylo was filed concurrently herewith and is incorporated herein by reference. The copending application describes a burnishing process suitable for providing substantially defect-free surfaces on the bonding pads of semiconductor devices without damaging the fragile devices.

The next step is aligning the two bonding pad surfaces (device and heatsink) so that they are substantially parallel. Even defect-free surfaces, if not parallel to each other, will cause point pressure, i.e. a highly localized excessive pressure, during thermocompression bonding.

When considering the size of the bonding area, about $7 \times 12$ mils, it becomes apparent that even the slightest degree of non-parallelism or defects can be a problem. Fine tuning the parallel alignment of each device to its heatsink in a production environment is not practical. Besides being time consuming, this would make the bonding surfaces parallel but would not eliminate surface defects. Likewise, a prior polishing process for heatsink and devices would serve to eliminate surface defects but would not insure parallelism of the bonding pads. Finally, mechanical scrubbing, a process in which the two bonding pads are rubbed together prior to bonding designed to make the bonding pad surfaces more compatible, typically causes exactly the type of substrate damage which is sought to be avoided during bonding. Reliable thermocompression bonding of 4 mil-thick GaAs and InP devices requires that the surfaces of the heatsink pad and device pad be as near perfect a match as possible.

It would be desirable, therefore, to have a method of custom-matching the two bonding surfaces to maximize the uniformity of the pressure applied during the subsequent thermocompression bonding steps.

SUMMARY OF THE INVENTION

A method for matching the bonding pad surfaces of a device and heatsinks to be bonded, which method maximizes the uniformity of pressure applied during thermocompression bonding, is disclosed. The method comprises using the collet of a die bonding machine to burnish the bonding pad on a heatsink. The collet is then traversed to a second workstage where the collet is used to pick up a device and burnish the device bonding pad against a suitable burnishing medium. The collet, with the device, is then traversed back to the main workstage where thermocompression bonding of the device to the heatsink is carried out. The alignment of the collet is locked and maintained throughout all of the steps to insure that all burnished surfaces are parallel and that the pressure during bonding is substantially perpendicular to those parallel surfaces.

BRIEF DESCRIPTION OF THE DRAWING

FIG. 1 illustrates an apparatus used to carry out the thermocompression bonding process.

FIG. 4 illustrates an apparatus used to carry out bonding according to the present invention with uniform, parallel bonding surfaces.

DETAILED DESCRIPTION OF THE INVENTION

Figure 2:
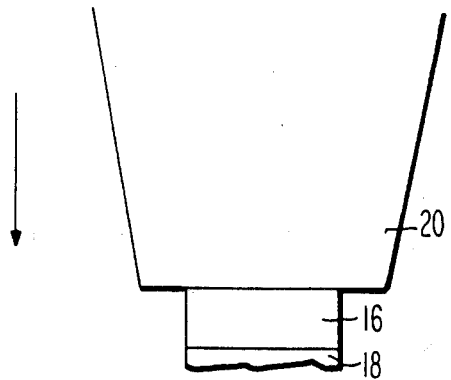
FIG. 2 illustrates an apparatus used to carry out a prior art bonding method with non-uniform bonding surfaces.
Figure 2:
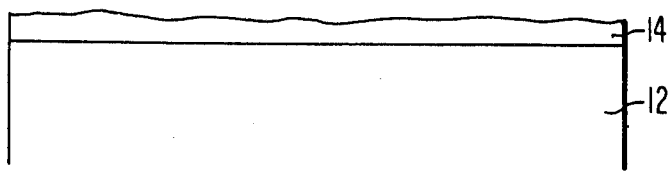

The present invention is an optimized method of thermocompression bonding wherein the device bonding pad and heatsink bonding pad surfaces are burnished so as to be smooth, defect-free and parallel to each other. This is accomplished by locking the alignment of the collet on a die bonding machine and utilizing this alignment to impart parallel surfaces on each bonding pad. This provides that the bonding surfaces of a heatsink and device to be bonded are custom-matched immediately prior to bonding. This further provides that the pressure applied during the bonding process is substantially perpendicular to the parallel, matched surfaces. In this way, the pressure applied to the device is substantially uniform across the bonding pad surface. The benefits of uniform pressure are: first, a better physical bond between the device and its heatsink with a consequent higher degree of thermal conductivity; and second, less risk of damage to the semiconductor device from localized excessive pressure. The present invention will be further described with reference to the Drawing.

FIG. 1 illustrates a die bonding apparatus used to carry out the present bonding process. A main workstage 10 of the die bonding apparatus, which has a heating means, supports a heatsink 12 with a bonding pad 14 thereon. A semiconductor device 16 including a bonding pad 18 is held by the collet 20 by way of a vacuum tube 22 therein. The collet 20 optionally has a heating means. In a typical thermocompression bonding process, the bonding pad 14 on the heatsink 12 is heated by the heating means of the main workstage 10 and the bonding pad 18 on the device 16 can be optionally heated by the collet 20 and is pressed against the heatsink 12 by the collet 20 with an appropriate pressure for a time sufficient to effectuate a bond between the bonding pads 14 and 18.

Figure 3:
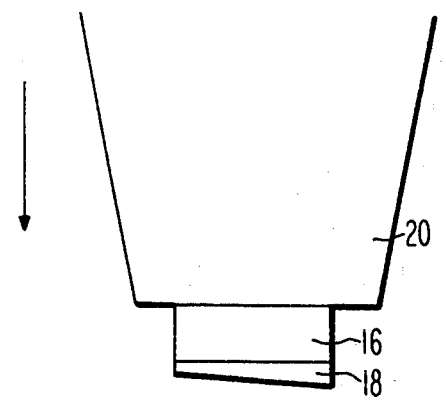
FIG. 3 illustrates an apparatus used to carry out a prior art bonding method with non-parallel bonding surfaces.
Figure 3:
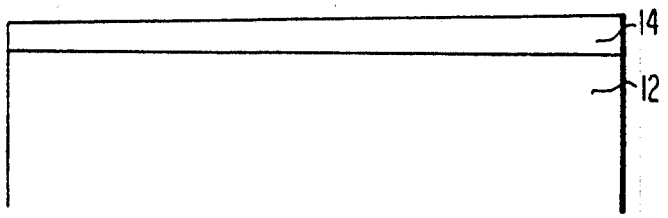

FIGS. 2 and 3 are enlarged views of the apparatus of FIG. 1 showing the bonding pad interface and illustrating some of the difficulties faced in thermocompression bonding by prior art methods. FIG. 2 shows the heatsink 12 with a bonding pad 14 thereon and the device 16 with a bonding pad 18. The device 16 is held by the collet 20. It can be seen that the bonding pads 14 and 18 have irregular surfaces. When the collet 20 presses the device 16 and heatsink 12 together there will be point contact of the protrusive irregularities of the bonding pads 14 and 18 causing non-uniform bonding of the pads 14 and 18 and highly localized excessive pressure at the point contacts which can easily damage the device 16.

FIG. 3 shows bonding pads 14 and 18 which have been polished or burnished and have no irregularities as in FIG. 2, but which are not parallel to each other. Again, it can be seen that when the collet 20 presses the heatsink 12 and the device 16 together, the two bonding pads 14 and 18 will not interface in a uniform manner. Those skilled in the art can further appreciate that even if the bonding pads 14 and 18 were defect-free and parallel to each other but not parallel to the bottom of the collet 20, a non-uniform pressure would result. This is because the force of the collet 20 is directly perpendicular to the bottom surface of the collet 20 which contacts the device 16.

Thus, for an ideal bonding process the bonding pads 14 and 18 should be defect-free, parallel to each other, and parallel to the bottom of the collet 20, i.e. perpendicular to the pressure applied during bonding. This situation is depicted in FIG. 4.

To carry out the method of the present invention, a heatsink with a suitable bonding pad thereon, such as gold or a gold alloy, is placed on the main workstage. The collet is coarsely aligned with the heatsink bonding pad and contacted with its surface. The collet is then moved in a front-to-back and side-to-side, or circular motion. Since the collet is typically of a much harder metal or alloy than the bonding pad, the bonding pad is effectively burnished by this motion. Once this burnishing is complete, the alignment of the collet is locked and maintained throughout the balance of the process. At this point the heatsink bonding pad surface is smooth, defect-free and completely parallel to the bottom of the collet.

Next, the collet, with alignment locked, is traversed to a second workstage where it picks up a semiconductor device with a bonding pad thereon. This second workstage is a burnishing medium suitable for burnishing bonding pads on semiconductor substrates such as that described in the copending Hawrylo application. Hawrylo employs a glass slide with small scratches of predetermined size and spacing therein. The collet rubs the device bonding pad against the scratched slide under a desired pressure until a defect-free surface results. At this point the device bonding pad surface is also totally parallel with the bottom of the collet.

The collet, carrying the device, now traverses back to the main workstage. The heatsink and/or device are heated to an appropriate temperature and the collet presses the heatsink and device together under a desired pressure for a desired time, as known in the thermocompression bonding art. During the bonding process, the bonding pad surfaces (heatsink and device) are defect-free, parallel to each other and perpendicular to the pressure applied.

Figure 5:
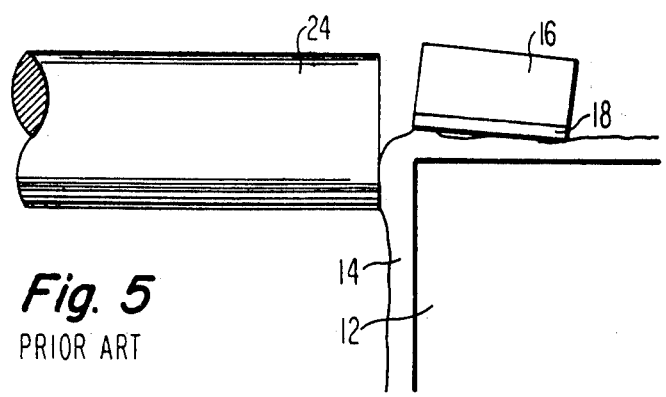
FIG. 5 illustrates coupling of a mounted semiconductor device to an optical fiber with non-uniform bonding surfaces.

FIG. 5 illustrates another difficulty encountered in bonding pad irregularities, that of optical coupling of a fiber to a mounted device. In FIG. 5, the heatsink 12 has a bonding pad 14 on its top and front surfaces. Without using the parallel burnishing method of the present invention, it can be seen that the device 16 and fiber 24 are extremely difficult to couple.

Figure 6:
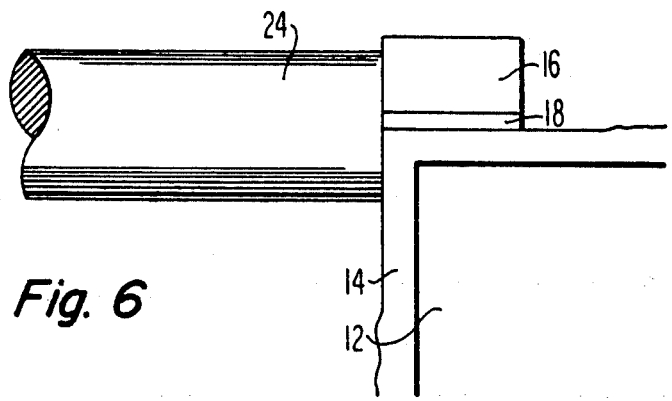
FIG. 6 illustrates coupling of a mounted semiconductor device to an optical fiber according to the present invention.

In accordance with the present invention, the collet, after burnishing the heatsink bonding pad and locking the alignment, can be dropped down so as to contact the back of the collet with the front of the heatsink. An up and down, or side to side, motion is established and the front of the heatsink is effectively burnished to a 90° angle with respect to the top of the heatsink. FIG. 6 illustrates the resultant coupling wherein the front and top surfaces of the heatsink bonding pad 14 have been burnished so as to accommodate the device 16 and the fiber 24.

Bonding devices to heatsinks using the method of the present invention has resulted in fewer instances of crystalline damage to the devices and lower thermal resistance for the bonds. Also, optical coupling of optical fibers to mounted devices is enhanced.

I claim:

1. A method of thermocompression bonding a semiconductor device having a bonding pad to a heatsink having a bonding pad using a die bonding machine which comprises:
   (1) placing the heatsink on a main workstage including heating means of the machine;
   (2) aligning a vacuum collet with the top surface of the heatsink bonding pad and locking in that alignment;
   (3) burnishing the heatsink bonding pad with the collet so it is parallel to the collet;
   (4) transporting the collet to a second workstage to pick up and burnish the device so it is parallel to the collet;
   (5) transporting the collet with the burnished device back to the main workstage;
   (6) placing the device on the heatsink so that the burnished, parallel bonding pads are in contact with each other; and (7) applying a desired pressure from the collet and desired heat from the heating means for a time sufficient to provide a bond between the device and the heatsink.

2. The method of claim 1 wherein the bonding pads are gold or any alloy thereof.

3. The method of claim 1 wherein the additional step of using the collet to burnish the front surface of the heatsink is inserted between steps (3) and (4) whereby the device mounted on the heatsink can be efficiently coupled to an optical fiber.

* * * * *